United States Patent
Cheng et al.

(10) Patent No.: US 8,273,664 B2
(45) Date of Patent: Sep. 25, 2012

(54) METHOD FOR ETCHING AND FILLING DEEP TRENCHES

(75) Inventors: Xiaohua Cheng, Shanghai (CN); Shengan Xiao, Shanghai (CN)

(73) Assignee: Shanghai Hua Hong NEC Electronics Co., Ltd., Shanghai (CN)

(*) Notice: Subject to any disclaimer, the term of this patent is extended or adjusted under 35 U.S.C. 154(b) by 0 days.

(21) Appl. No.: 13/156,286

(22) Filed: Jun. 8, 2011

(65) Prior Publication Data

US 2011/0306189 A1    Dec. 15, 2011

(30) Foreign Application Priority Data

Jun. 12, 2010   (CN) .......................... 2010 1 0200461

(51) Int. Cl.
*H01L 21/311* (2006.01)
(52) U.S. Cl. ................. 438/700; 438/270; 257/E21.54; 257/E21.102
(58) Field of Classification Search ................ 438/488, 438/492, 270, 700; 257/E21.103, E21.102, 257/E21.54
See application file for complete search history.

(56) References Cited

U.S. PATENT DOCUMENTS

| 6,121,148 A * | 9/2000 | Bashir et al. .................. 438/692 |
| 6,251,734 B1 | 6/2001 | Grivna et al. |
| 7,015,115 B1 | 3/2006 | Yin et al. |
| 2007/0015366 A1* | 1/2007 | Enda et al. ..................... 438/692 |
| 2009/0079026 A1* | 3/2009 | Zhu et al. ....................... 257/510 |

FOREIGN PATENT DOCUMENTS

| CN | 101000894 A | 7/2007 |
| CN | 101692434 A | 4/2010 |

* cited by examiner

*Primary Examiner* — William D Coleman
*Assistant Examiner* — Christine Enad
(74) *Attorney, Agent, or Firm* — Blakely, Sokoloff, Taylor & Zafman

(57) ABSTRACT

A method of etching and tilling deep trenches is disclosed, which includes: forming an ONO(oxide-nitride-oxide) sandwich layer on a semiconductor substrate; forming deep trenches by using top oxide of the sandwich layer as a stop layer; removing the top oxide and middle SiN of the sandwich layer; tilling the deep trenches with epitaxial film or polysilicon film; polishing the wafer to get a planarized surface by stopping at the surface of the bottom oxide layer; removing the bottom oxide layer.

13 Claims, 4 Drawing Sheets

METHOD FOR ETCHING AND FILLING DEEP TRENCHES

CROSS-REFERENCES TO RELATED APPLICATIONS

This application claims the priority of Chinese patent application number 201010200461.5, filed on Jun. 12, 2010, the entire contents of which are incorporated herein by reference.

FIELD OF THE INVENTION

The present invention relates to a method for manufacturing a semiconductor device, particularly a superjunction device with deep trenches.

BACKGROUND

Normally, a trench with a depth of more than 10 μm is defined as a deep trench. Deep trench structures are widely used in semiconductor manufacturing in nowadays. For example, a deep trench can function as an isolation module to isolate power MOS transistors with different operation voltages; a deep trench can also be used in a superjunction MOSFET as a P type pillar in an N type drift layer structure (or an N type pillar in a P type drift layer structure) to form a P-N depletion junction to balance the electric field, so that insulation breakdown can be prevented, and high breakdown voltage can be achieved.

Conventional manufacturing method of superjunction MOSFET structure includes: growing an N type epitaxial layer as a drift layer on a P type substrate; forming a deep trench in the N type epitaxial layer by plasma etching; filling the deep trench with P type epitaxial film or P type polysilicon; planarize the surface of the deep trench by CMP process. Thus, a P-N junction structure with alternating N type and P type regions is formed, wherein the deep trench is functioned as a P-pillar, the N type epitaxial layers beside the deep trench are functioned as N-drift regions. A similar function can be achieved by exchanging the N type and P type silicons.

The above method may have the following problems. On one hand, since N drift and P pillar regions are both made of silicon, it is difficult to distinguish the P pillar from the N drift regions during the CMP process, as a result, it is impossible to carry out selective removal, and the polishing may cause damage to the active area and hence influence the device performance. On the other hand, as the substrate and the material filled in the deep trench have the same type, it is hard to control polishing stop point during the CMP process.

BRIEF SUMMARY OF THE DISCLOSURE

An object of the present invention is to provide a method for etching and filling deep trenches to protect the substrate from polishing damage during CMP process, and to attain good process control.

In order to achieve the above object, the present invention provides a method for etching and filling deep trenches, which includes:

step 1, deposit an ONO (oxide-nitride-oxide) layer on a substrate, the ONO layer includes a bottom silicon oxide layer, a middle silicon nitride layer and a top silicon oxide layer;

step 2, etch a deep trench in the substrate, which further includes:

form a shallow trench in the ONO layer by removing at least part of the top silicon oxide layer;

etch in the shallow trench to form a deep trench by using remaining part of the top silicon oxide layer as an etch stop layer;

step 3, remove the top silicon oxide layer and the middle silicon nitride layer;

step 4, fill the deep trench with epitaxial film and/or polysilicon film;

step 5, planarize the surface of the deep trench by using the bottom silicon oxide layer as a stop layer;

step 6, remove the bottom silicon oxide layer.

In the present invention, the oxide layers of the ONO sandwich layer are used as stop layers. Firstly, the top oxide layer is used as an etch stop layer during the step of deep trench etch. The middle SiN layer is used to protect the bottom oxide layer from damage during deep trench etch and top oxide removal, thus remaining a good thickness uniformity of the bottom oxide layer. Finally, the bottom oxide layer is used as a stop layer during the CMP process. Compared with conventional methods, the present invention can achieve better process control during trench etching and CMP.

DETAILED DESCRIPTION

The present invention is further detailed by embodiments in combination with the drawings. In the following descriptions, the term "N type" includes the meaning of N+ type and N− type; the term "P type" includes the meaning of P+ type and P− type.

Figure 1:
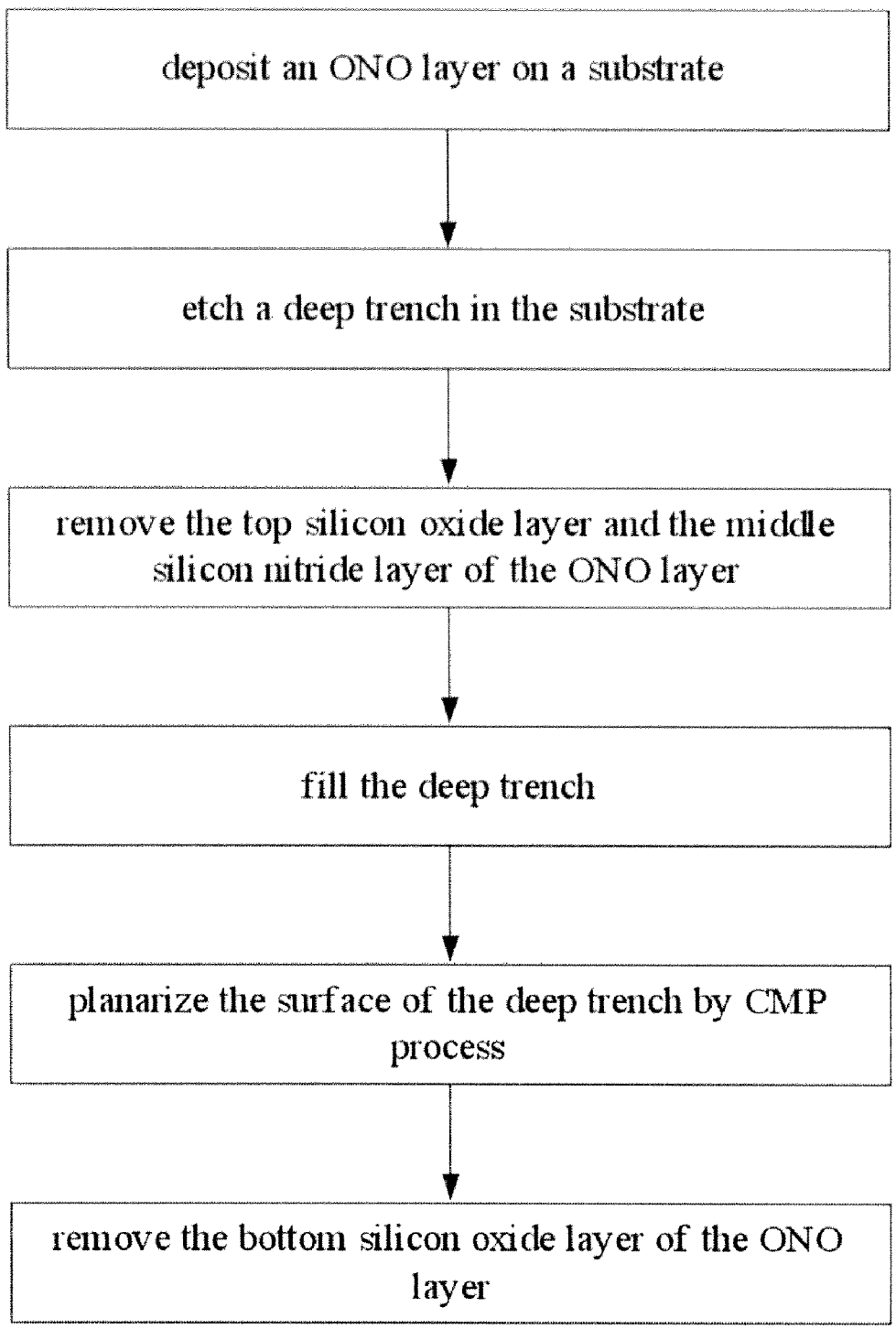
FIG. 1 is a flow chart of the method for etching and filling deep trenches according to the present invention.
Figure 2A:
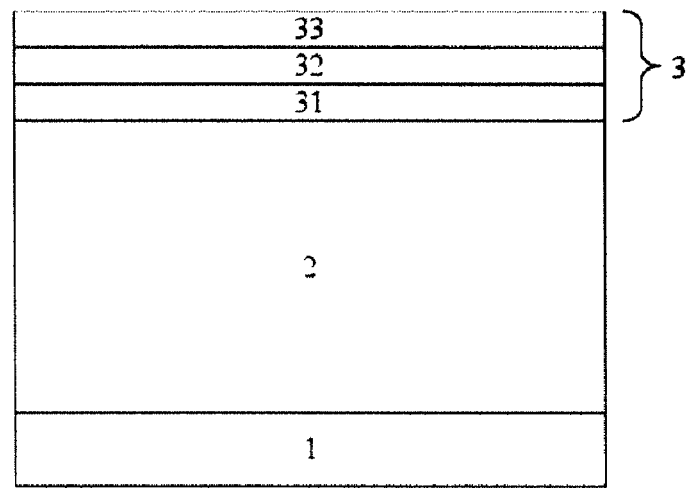
FIG. 2A~FIG. 2F are sectional views of the method for etching and filling deep trenches according to the present invention.

Please refer to FIG. 1 and FIGS. 2A~2F, the method for etching and filling deep trenches of the present invention includes the following steps:

Step 1, deposit an ONO layer 3 on a substrate (see FIG. 2A).

The substrate may be a silicon substrate alone or a silicon substrate having an epitaxial layer formed on it. FIG. 2A shows the latter structure, namely in this embodiment, the substrate is composed of a silicon substrate 1 and an epitaxial layer 2 (also called drift layer), wherein the epitaxial layer 2 is an N− type epitaxial layer. Those skilled in the art shall understand that the epitaxial layer 2 may also be a P− type epitaxial layer. The thickness of the epitaxial layer 2 is in a range of 10~100 μm.

The ONO layer 3 is a sandwich structure composed of a bottom silicon oxide layer 31, a middle silicon nitride layer 32 and a top silicon oxide layer 33 from the bottom up. The ideal thickness of the bottom silicon oxide layer 31 is in a range of 10~5000 Å; the ideal thickness of the middle silicon nitride layer 32 is in a range of 10~5000 Å; the ideal thickness of the top silicon oxide layer 33 is in a range of 10~30000 Å. Although in FIG. 2A~2F, the three layers 31~33 seem to have the same thickness, those skilled in the art shall understand that the thickness of the three layers 31~33 may vary from one another. Generally, the middle and bottom layers 32, 31 may have similar or same thickness, while the top layer, namely the top silicon oxide layer 33 may have a much larger thickness than that of the bottom silicon oxide layer 31.

The formation of the ONO layer 3 follows the below sequence: firstly, deposit the bottom oxide layer 31 with an ideal thickness of 10~5000 Å; then, deposit the middle nitride layer 32 with an ideal thickness of 10~5000 Å; finally, deposit the top oxide layer 33 with an ideal thickness of 10~30000 Å. Each of the three layers 31~33 could be formed by thermal oxidation, APCVD (Atmospheric-Pressure Chemical Vapor Deposition), LPCVD (Low-Pressure Chemical Vapor Deposition) or PECVD (Plasma Enhanced Chemical Vapor Deposition).

Figure 2B:
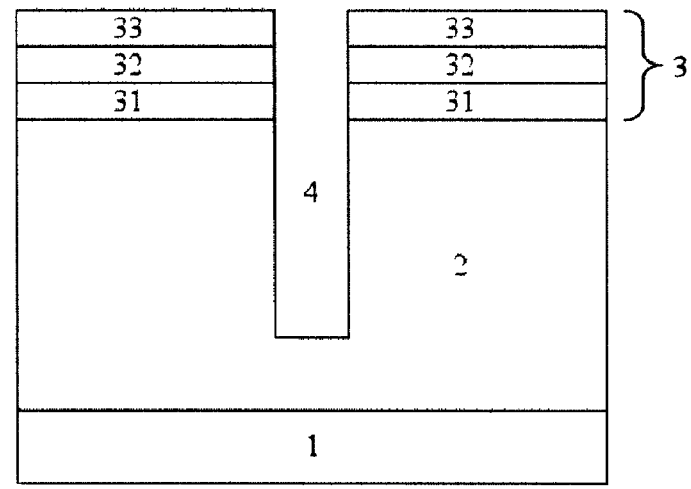

Step 2, form a deep trench 4 in the substrate by photolithography and etch (see FIG. 2B). During the etch process, the top silicon oxide layer 33 of the ONO layer is used as an etch stop layer.

Normally, the depth of the deep trench 4 is more than 10 μm. Preferably, for a deep trench having a width (CD) of 1~4 μm, the ideal depth is 10~100 μm. The deep trench may he formed in the epitaxial layer 2 without reaching the bottom surface of the epitaxial layer 2 (as shown in FIG. B); or the bottom of the deep trench 4 may just reach the interface of the epitaxial layer 2 and the silicon substrate 1; or the deep trench may be etched through the epitaxial layer 2 into the silicon substrate 1.

Figure 3A:
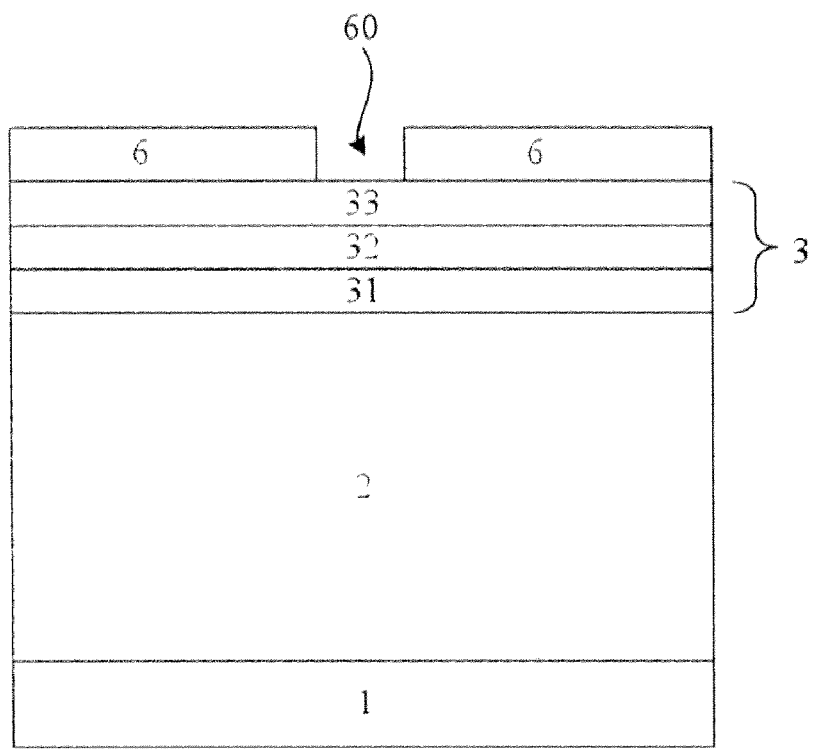
FIG. 3A~FIG. 3B are sectional views of the step of etching deep trenches according to the present invention.

Please refer to FIGS. 3A~3B, the step of forming a deep trench by photolithography and etch is as follows:

Step 20, as shown in FIG. 3A, coat a photoresist layer 6 on the ONO layer 3 and form an etch window 60 in the photoresist layer 6 by exposure and development to expose the surface of the ONO layer 3, wherein the position and dimension of the etch window is determined by the deep trench to be formed.

Figure 3B:
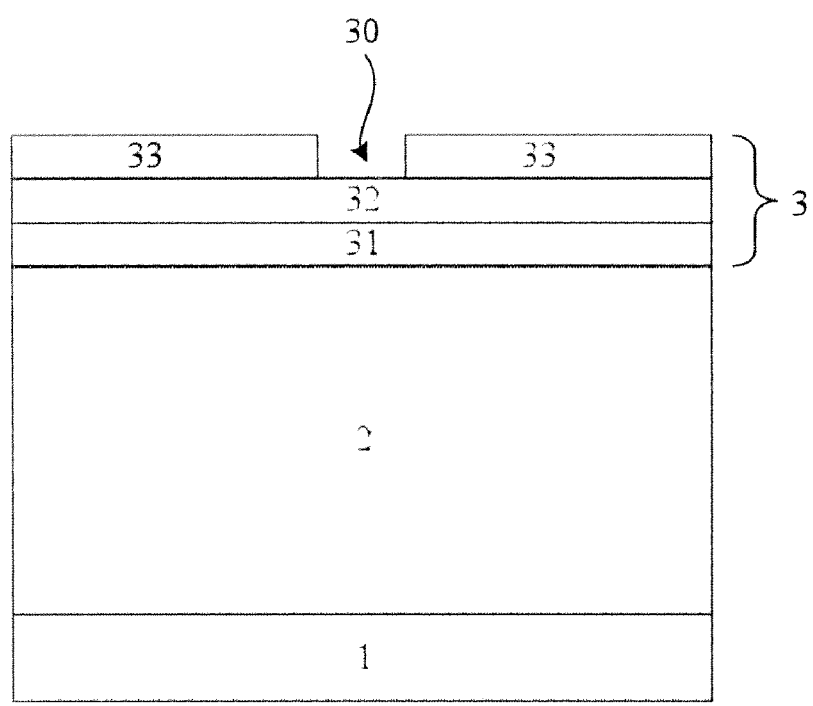

Step 21, as shown in FIG. 3B, remove the top silicon oxide layer 33 in the etch window 60 by using the photoresist layer 6 as hardmask and then remove the photoresist layer 6. After this step, a shallow trench 30 is formed in the ONO layer 3. Optionally, the middle silicon nitride layer 32, or the middle silicon nitride layer 32 and the bottom silicon oxide layer 31 in the etch window 60 may also be removed during this step.

Step 22, continue to etch in the shallow trench 30 to form a deep trench 4 in the substrate by dry etch. During this step, the top silicon oxide layer 33 of the ONO layer 3 is functioned as an etch stop layer to protect the middle silicon nitride layer 32, the bottom silicon oxide layer 31 and the substrate below it from being etched. The process of deep trench etching is as follows:

Firstly, in step 22a, remove the remaining ONO layer in the shallow trench by etch. If in step 21, only the top silicon oxide layer 33 in the etch window 60 was removed, then in this step, remove the middle silicon nitride layer 32 and the bottom silicon oxide layer 31 in the shallow trench; if both the top oxide layer 33 and the middle nitride layer 32 were removed in step 21, then remove the bottom oxide layer 31 in the shallow trench in this step. In the above two cases, when the bottom silicon oxide layer 31 in the shallow trench 30 is removed, the thickness of the top silicon oxide layer 33 at both sides of the shallow trench 30 will also be reduced due to the effect of the etchant; however, since the top oxide layer 33 usually has a much larger thickness than the bottom oxide layer 31, a part of the top oxide layer 33 will be remained after step 22a. If the ONO layer in the etch window 60 was totally removed in step 21, then skip to step 22b below.

Then, in step 22b, etch the silicon body, namely the substrate in the shallow trench 30 to form a deep trench. By using an echant having an etch selectivity of silicon over oxide, the silicon body will be etched while only a part of the top silicon oxide layer 33 outside the shallow trench is removed, thus enabling the remaining top silicon oxide layer 33 to protect the structure below it.

As shown in FIG. 2B, after step 22b, the deep trench 4 is formed in the substrate.

Figure 2C:
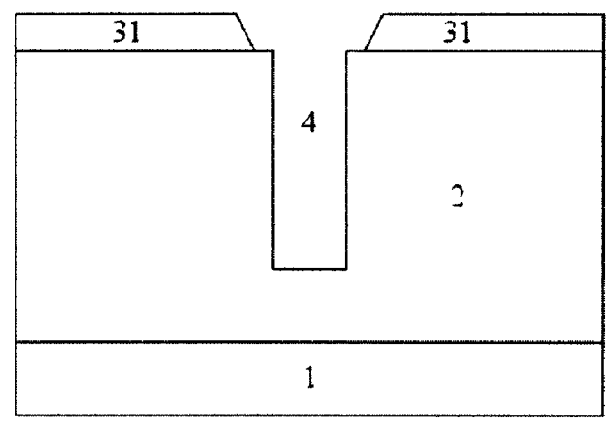

Step 3, as shown in FIG. 2C, remove the top silicon oxide layer 33 and the middle silicon nitride layer 32. It is preferable to remove the top silicon oxide layer 33 first by using the middle silicon nitride layer 32 as a protection layer to the bottom silicon oxide layer 31, so that the thickness of the bottom silicon oxide layer 31 will remain unchanged, in other words, the bottom silicon oxide layer 31 will remain to have a good thickness uniformity. Then, the middle silicon nitride layer 32 is removed. In practice, the two layers 33, 32 may both be removed by dry etch or wet etch. HF may he used for silicon oxide wet removal, hot H3PO4 may be used for silicon nitride wet removal. A combination of silicon oxide dry etch and silicon nitride wet removal or silicon oxide wet removal and silicon nitride dry etch is also feasible.

If the top silicon oxide layer 3 is removed by wet etch, the bottom silicon oxide layer 31 will be etched in the horizontal direction due to the effect of lateral erosion. In such a case, part of the substrate surface on both sides of the deep trench 4 will be exposed after step 3 (see FIG. 2C).

Figure 2D:
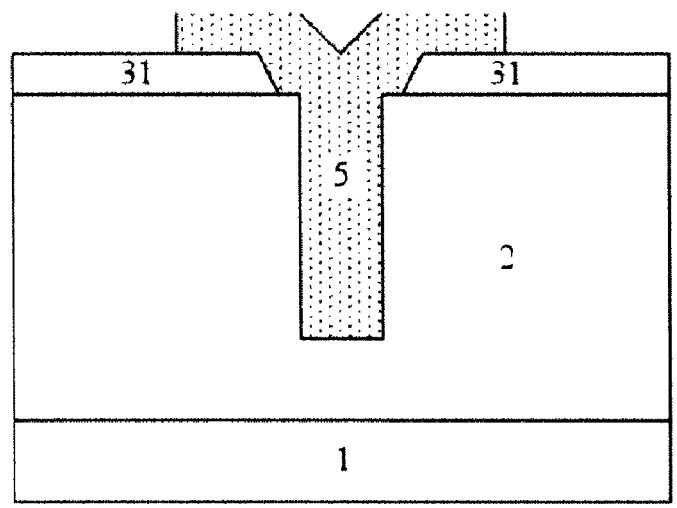

Step 4, as shown in FIG. 2D, fill the deep trench 4 with epitaxial film or polysilicon film or the combination 5. For example, the deep trench 4 may be filled by epitaxial growth of a monocrystal silicon film or by deposition of a polysilicon film or by firstly growing a monocrystal silicon epitaxial film and then depositing a polysilicon film. A CVD equipment is preferred for epitaxial growth. During the process of epitaxial growth, a mixture of silicon source gas, halide gas and doping gas are used as reaction gas, wherein the silicon source gas may be selected from silane, dichlorosilane, trichlorosilane, etc.; the halide gas may be HCl, which is used to prevent epitaxial growth at top of the deep trench 4 so that the opening of the deep trench 4 will not be closed before the deep trench 4 is completely filled; the doping gas may be boron hydride for P type epitaxial growth, phosphine or arsenic hydride for N type epitaxial growth. LPCVD is preferred during the process of polysilicon deposition if the deep trench 4 is tilled by a combination of monocrystal silicon epitaxial film and polysilicon film.

Figure 2E:
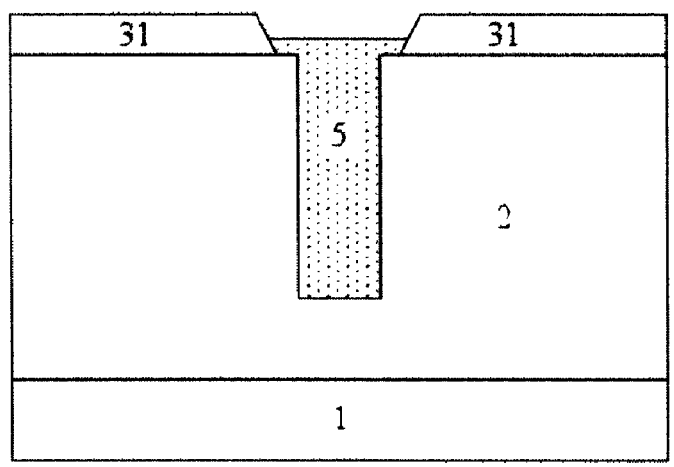

Step 5, as shown in FIG. 2E, planarize the surface of the deep trench 4 by CMP process, wherein the bottom silicon oxide layer 31 of the ONO layer is used as a stop layer during this process; in other words, the CMP process is stopped at the surface of the bottom silicon oxide layer 31, so that no silicon is remained on the bottom silicon oxide layer 31 after the CMP process. In practice, after this step, the surface of the deep trench 4, namely the surface of the silicon 5 filled in the deep trench 4 will be lower than the surface of the bottom silicon oxide layer 31 due to different erosion rates of slurry to different materials during CMP.

Figure 2F:
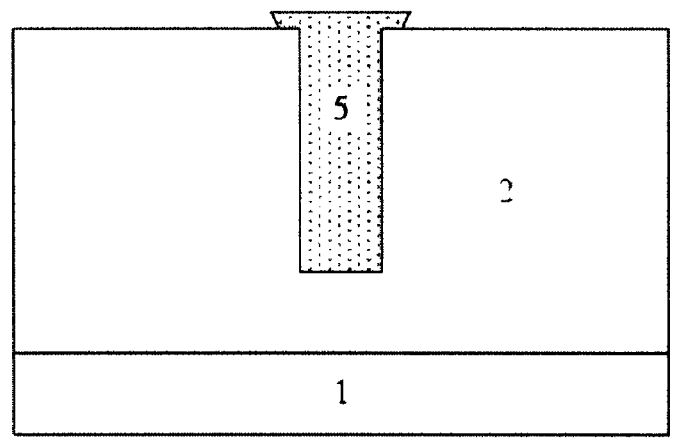

Step 6, as shown in FIG. 2F, remove the bottom silicon oxide layer 31. Similar to step 3, the bottom silicon oxide layer 31 may be removed either by dry etch or by wet etch. Finally, a P type pillar 5 in an N type drift region 2 is formed.

Although the above embodiment is described by taking the formation of one P type pillar in N type drift region as example, those skilled in the art shall understand that the method for etching and filling deep trenches according to the present invention may also be used to simultaneously form more than one deep trenches in the substrate; besides, N type pillars in P type drift regions can be easily implemented by changing the type of dopants.

In a summary, the present invention forms an ONO layer 3 on the substrate before etching the deep trenches. The top oxide layer 33 acts as a stop layer during the step of etching deep trenches. The middle SiN layer 32 is used to protect the bottom oxide layer 31 from damage during the removal of top oxide layer 33, so as to remain a good thickness uniformity of the bottom oxide layer 31, which is advantageous for CMP process control.

If only one oxide layer is deposited on the substrate, and is used as a stop layer both in deep trench etching process and CMP process, the oxide layer may have poor thickness uniformity after deep trench etching due to the fluctuation of process. This poor thickness uniformity will be disadvantageous for CMP process control.

By adopting the ONO structure, the bottom oxide layer will not be damaged during the steps of deep trench etching and filling, so that the thickness of the bottom oxide layer can be adjusted according to the process and device requirement. Generally, the thinner the bottom oxide layer is, the less effect of lateral erosion will arise during the step of wet etch, and the better device performance and reliability can be achieved.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A method for etching and filling deep trenches, comprising the following steps in the sequence set forth:
    depositing an ONO layer on a substrate, the ONO layer comprising a bottom silicon oxide layer, a middle silicon nitride layer and a top silicon oxide layer;
    etching a deep trench in the substrate, further comprising:
        forming a shallow trench in the ONO layer by removing at least part of the top silicon oxide layer;
        etching in the shallow trench to form a deep trench by using a remaining part of the top silicon oxide layer as an etch stop layer;
    removing the top silicon oxide layer and the middle silicon nitride layer; filling the deep trench with epitaxial film and/or polysilicon film;
    planarizing surface of the deep trench by using the bottom silicon oxide layer as a stop layer; and
    removing the bottom silicon oxide layer.

2. The method according to claim 1, wherein the substrate is a silicon substrate.

3. The method according to claim 1, wherein the substrate is a silicon substrate having an epitaxial layer formed thereon, the epitaxial layer having a thickness of 10~100 μm.

4. The method according to claim 1, wherein:
    the bottom silicon oxide layer has a thickness of 10~5000 Å;
    the middle silicon nitride layer has a thickness of 10~5000 Å;
    the top silicon oxide layer has a thickness of 10~30000 Å.

5. The method according to claim 1, wherein the ONO layer is formed by thermal oxidation, APCVD, LPCVD or PECVD.

6. The method according to claim 1, wherein the step of forming a shallow trench in the ONO layer further comprises:
    depositing a photoresist layer on the ONO layer;
    forming an etch window in the photoresist layer to expose the ONO layer, the etch window corresponding to the deep trench to be formed;
    removing at least the top silicon oxide layer of the ONO layer in the etch window to form the shallow trench; and
    removing the photoresist layer.

7. The method according to claim 1, wherein the deep trench has a width of 1~4 μm and a depth of 10~100 μm.

8. The method according to claim 1, wherein the top silicon oxide layer and the middle silicon nitride layer of the ONO layer are both removed by dry etch or wet etch.

9. The method according to claim 1, wherein the top silicon oxide layer and the middle silicon nitride layer of the ONO layer are removed by:
    first removing the top silicon oxide layer by dry etch, and then removing the middle silicon nitride layer by wet etch; or
    first removing the top silicon oxide layer by wet etch, and then removing the middle silicon nitride layer by dry etch.

10. The method according to claim 1, wherein the deep trench is tilled with epitaxial film by epitaxial growth process, or tilled with polysilicon film by CVD process, or tilled by firstly growing an epitaxial film in the deep trench and then filling the deep trench with polysilicon film by CVD process.

11. The method according to claim 1, wherein the surface of the deep trench is planarized by chemical mechanical polishing.

12. The method according to claim 11, wherein the chemical mechanical polishing stops at the surface of the bottom silicon oxide layer.

13. The method according to claim 1, wherein the bottom silicon oxide layer is removed by dry etch or wet etch.

* * * * *

UNITED STATES PATENT AND TRADEMARK OFFICE
CERTIFICATE OF CORRECTION

| | |
|---|---|
| PATENT NO. | : 8,273,664 B2 |
| APPLICATION NO. | : 13/156286 |
| DATED | : September 25, 2012 |
| INVENTOR(S) | : Xiaohua Cheng et al. |

It is certified that error appears in the above-identified patent and that said Letters Patent is hereby corrected as shown below:

In the Claims, Column 6, Claim 10, line 37 please delete "tilled" and insert --filled--.

Column 6, Claim 10, line 38 please delete "tilled" and insert --filled-- in both instances of occurrence within the line.

Signed and Sealed this
Twenty-first Day of May, 2013

Teresa Stanek Rea
*Acting Director of the United States Patent and Trademark Office*